(12) United States Patent  
Lee

(10) Patent No.: US 8,977,078 B2  
(45) Date of Patent: Mar. 10, 2015

(54) OPTICAL PRINTED CIRCUIT BOARD AND METHOD FOR MANUFACTURING THE SAME

(75) Inventor: Hyoun Jeong Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/997,396

(22) PCT Filed: Dec. 21, 2011

(86) PCT No.: PCT/KR2011/009911  
§ 371 (c)(1),  
(2), (4) Date: Aug. 16, 2013

(87) PCT Pub. No.: WO2012/087014  
PCT Pub. Date: Jun. 28, 2012

(65) Prior Publication Data  
US 2013/0322814 A1 Dec. 5, 2013

(30) Foreign Application Priority Data  
Dec. 24, 2010 (KR) .................. 10-2010-0134545

(51) Int. Cl.  
*G02B 6/12* (2006.01)  
*G02B 6/125* (2006.01)  
*G02B 6/43* (2006.01)  
*H05K 1/02* (2006.01)

(52) U.S. Cl.  
CPC *G02B 6/125* (2013.01); *G02B 6/43* (2013.01); *H05K 1/0274* (2013.01); *H05K 2201/10121* (2013.01)  
USPC ................. 385/14; 29/846; 385/32; 385/88

(58) Field of Classification Search  
CPC ................. H01L 2224/48091; G02B 6/125; G02B 6/43; G02B 6/4214; G02B 6/136; G02B 6/122; G02B 6/3829; H05K 1/0274; H05K 3/4602  
USPC .................................. 385/14, 88–92; 29/846  
See application file for complete search history.

(56) References Cited

U.S. PATENT DOCUMENTS

| 6,594,435 | B2 * | 7/2003 | Tourne ......................... 385/136 |
| 7,486,847 | B1 * | 2/2009 | Dellmann et al. ............... 385/14 |
| 7,802,927 | B2 * | 9/2010 | Benjamin et al. ............... 385/88 |
| 8,705,916 | B2 * | 4/2014 | Okuyama et al. ............... 385/32 |

(Continued)

FOREIGN PATENT DOCUMENTS

KR 10-2004-0079385 A 9/2004  
KR 10-2004-0106674 A 12/2004

(Continued)

OTHER PUBLICATIONS

International Search Report in International Application No. PCT/KR2011/009911, filed Dec. 21, 2011.

(Continued)

*Primary Examiner* — Ellen Kim  
(74) *Attorney, Agent, or Firm* — Saliwanchik, Lloyd & Eisenschenk

(57) ABSTRACT

An optical printed circuit board according to the embodiment includes an insulating layer; an optical wave guide buried in the insulating layer to transmit an optical signal; and an optical path converting part provided on at least one end of the optical wave guide to convert a transmission path of the optical signal defined by the optical wave guide such that the transmission path has a predetermined curvature.

19 Claims, 3 Drawing Sheets

(56) References Cited

U.S. PATENT DOCUMENTS

| | | |
|---|---|---|
| 2005/0220437 A1 | 10/2005 | Kim et al. |
| 2006/0045418 A1 | 3/2006 | Cho et al. |
| 2007/0292081 A1* | 12/2007 | Hashimoto et al. ............. 385/52 |
| 2009/0263923 A1* | 10/2009 | Shimooka ....................... 438/31 |

FOREIGN PATENT DOCUMENTS

| | | |
|---|---|---|
| KR | 10-2005-0049628 A | 5/2005 |
| KR | 10-2005-0097693 A | 10/2005 |
| KR | 10-0623477 B1 | 9/2006 |
| KR | 10-2010-0066013 A | 6/2010 |

OTHER PUBLICATIONS

Notice of Allowance dated Feb. 13, 2013 in Korean Application No. 10-2010-0134545, filed Dec. 24, 2010.

Office Action dated Jan. 17, 2012 in Korean Application No. 10-2010-0134545, filed Dec. 24, 2010.

* cited by examiner

[Fig. 1]
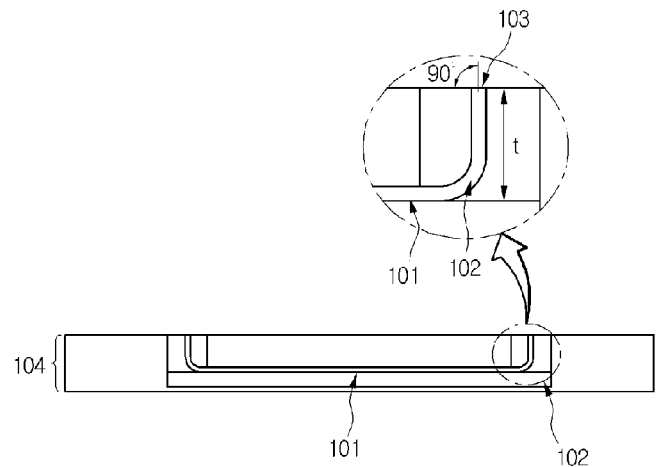
[Fig. 2]
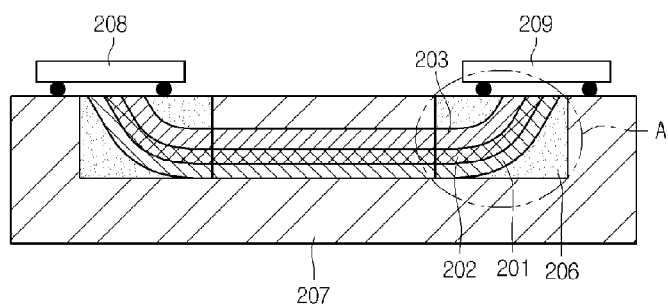
[Fig. 3]
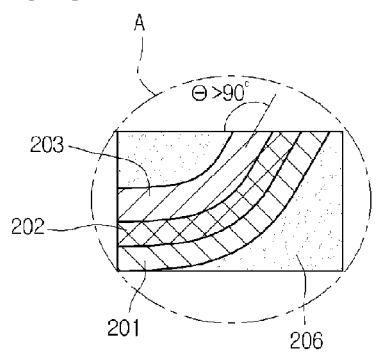
[Fig. 4]
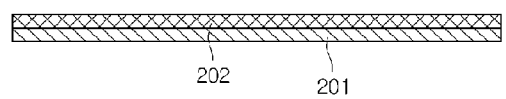
[Fig. 5]
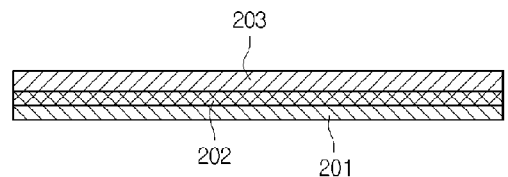

[Fig. 6]
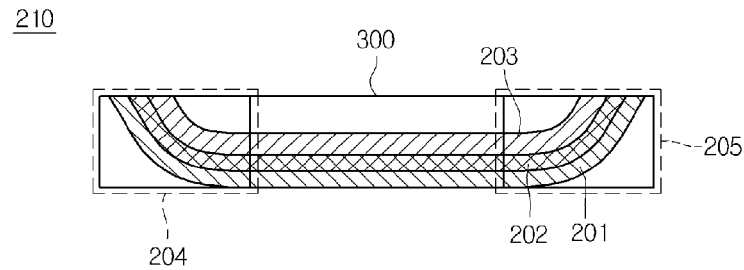
[Fig. 7]
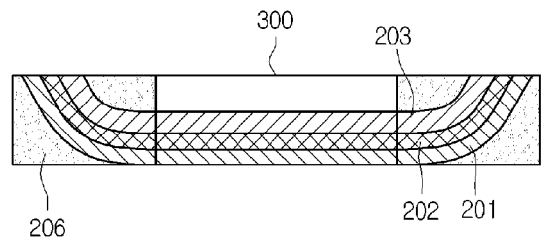
[Fig. 8]
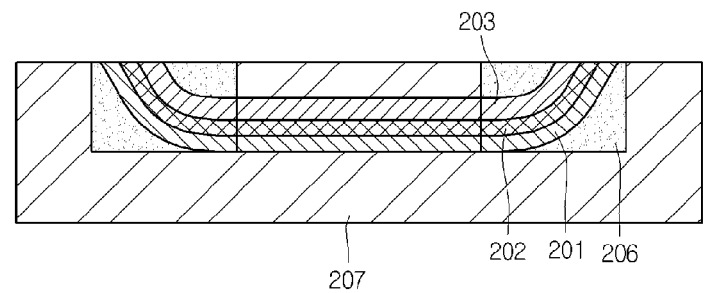
[Fig. 9]
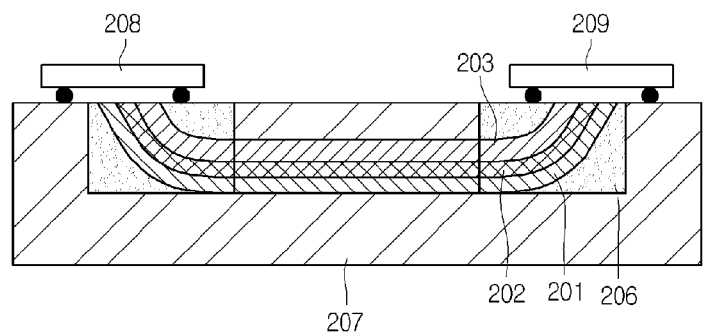
[Fig. 10]
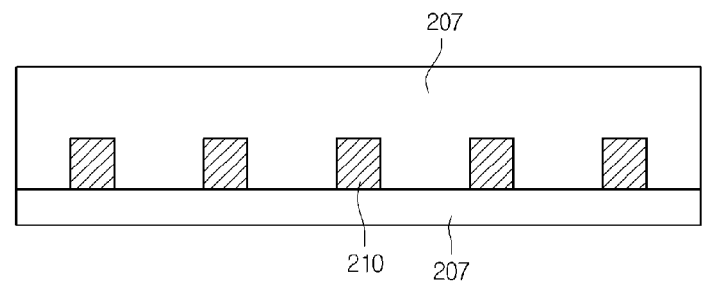

[Fig. 11]
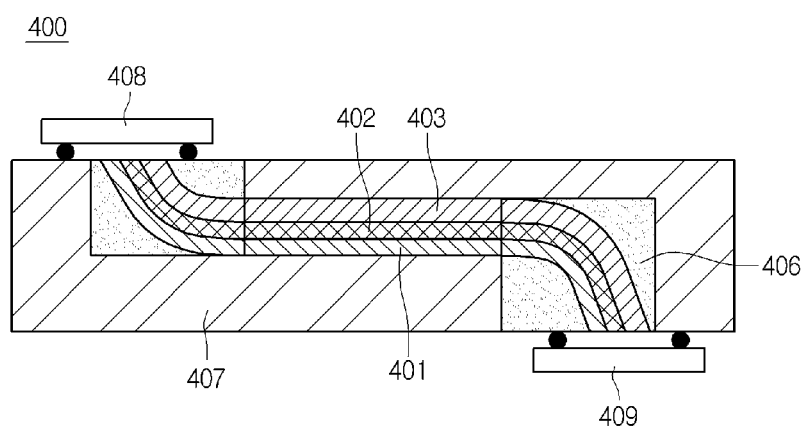

OPTICAL PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/009911, filed Dec. 21, 2011, which claims priority to Korean Application No. 10-2010-0134545, filed Dec. 24, 2010, the disclosures of each of which are incorporated herein by reference in their entirety.

TECHNICAL FIELD

The embodiment relates to an optical printed circuit board and a method for manufacturing the same.

BACKGROUND ART

In general, a printed circuit board (PCB) is manufactured by using a copper clad laminate in which a conductive layer is laminated on an insulating member. The PCB can be manufactured by forming circuit patterns on the copper clad laminate, which is called an electric PCB. Since the electric PCB uses conductive metals, such as copper, as electric interconnections for transmitting signals, the electric PCB represents limitations in transmission of mass storage date.

In order to solve the above problem, recently, an optical PCB including an optical wave guide formed on an insulating member has been developed. In order to form the optical wave guide serving as an optical path in the optical PCB, optical fiber including polymer or glass fiber is employed.

FIG. 1 shows a sectional view of an optical PCB according to the related art as well as a partially enlarged view of the optical PCB.

Referring to FIG. 1, an optical wave guide 101 is laminated on the optical PCB 104. The optical wave guide 101 includes an optical path changing part 102, which is bent at the right angle to change an optical path at the right angle.

In the case of the optical PCB 104 formed with the optical wave guide 101 accommodated therein, the final thickness of the optical PCB 104 may depend on the thickness t of the optical wave guide 101.

As shown in the partially enlarged view of FIG. 1, the thickness t of the optical wave guide 101 refers to the distance from a horizontal section of the optical wave guide 101 to a tip of a bending section of the optical wave guide 101. If the optical wave guide 101 is vertically laminated, a section 103 of the optical wave guide 101 exposed through a top surface of the optical PCB 104 has an area equal to a vertical sectional area of the optical wave guide 101. If the optical wave guide 101 has a small sectional area, light alignment is difficult.

If the thickness of the optical wave guide 101 is reduced in order to reduce the thickness of the optical PCB 104, the optical wave guide 101 must be bent with a smaller radius of curvature, so the optical wave guide 101 may be easily broken.

As described above, if the optical wave guide is vertically laminated, the section of the optical wave guide exposed through the top surface of the optical PCB has the area equal to the vertical sectional area of the optical wave guide, and the light alignment is difficult if the optical wave guide has a small sectional area.

In addition, since the optical path changing part is manufactured by bending the optical wave guide at the right angle to change the optical path at the right angle, light loss may be generated due to the bending structure of the optical wave guide and the optical wave guide may be broken caused by high tension as the bending work is carried out. For this reason, the thickness of the optical PCB is inevitably increased.

DISCLOSURE OF INVENTION

Technical Problem

The embodiment provides an optical PCB having a novel structure and a method for manufacturing the same.

The embodiment provides an optical PCB capable of improving the light transmission efficiency by forming an optical path with an obtuse angle.

Objects of the embodiment may not be limited to the above and other objects and advantages of the embodiment may be clearly comprehended through the following description.

Solution to Problem

An optical printed circuit board according to the embodiment includes an insulating layer; an optical wave guide buried in the insulating layer to transmit an optical signal; and an optical path changing part provided on at least one end of the optical wave guide to change a transmission path of the optical signal defined by the optical wave guide such that the transmission path has a predetermined curvature.

The optical path changing part includes a first optical path changing part provided on a first end of the optical wave guide to change the transmission path of the optical signal and a second optical path changing part provided on a second end of the optical wave guide in opposition to the first end to change the transmission path of the optical signal.

The first and second optical path changing parts change the transmission path of the optical signal defined by the optical wave guide such that the transmission path has a predetermined curvature of an obtuse angle.

The first and second optical path changing parts include thermosetting insulating materials surrounding the optical wave guide to keep the optical wave guide at the obtuse angle.

The optical wave guide includes a first region parallel to a top surface or a bottom surface of the insulating layer, a second region extending from one end of the first region and having a predetermined curvature of an obtuse angle, and a third region extending from the other end of the first region and having a predetermined curvature of an obtuse angle.

At least one end of the second and third regions is exposed through a top surface or a bottom surface of the insulating layer.

The first and second optical path changing parts include a thermosetting insulating material having a glass transition temperature higher than a glass transition temperature of a material for the insulating layer or include a liquid-phase thermosetting material.

The optical wave guide includes a core layer to transmit the optical signal and at least one clad layer surrounding the core layer. The core layer includes a material having a refractive index higher than a refractive index of a material for the clad layer. The core layer includes at least one of silica and SiO2 mixed with polymer.

The optical wave guide has a multi-channel structure or a multi-layer structure.

A method for manufacturing an optical printed circuit board according to the embodiment includes the steps of forming an optical wave guide to transmit an optical signal;

forming an optical path changing part to change a transmission path of the optical signal by bending at least one end of the optical wave guide; and burying the optical wave guide having at least one end bent by the optical path changing part in an insulating layer.

The step of forming the optical path changing part includes the steps of forming a first optical path changing part to change the transmission path of the optical signal by bending a first end of the optical wave guide, and forming a second optical path changing part to change the transmission path of the optical signal by bending a second end of the optical wave guide, which is opposite to the first end.

The step of forming the first and second optical path changing parts includes a step of changing the transmission path of the optical signal defined by the optical wave guide such that the transmission path has a predetermined curvature of an obtuse angle.

The steps of forming of the first and second optical path changing parts includes a step of surrounding the optical wave guide by the first and second optical path changing parts including thermosetting insulating materials such that the optical wave guide is kept at the obtuse angle obtained by bending the optical wave guide.

The thermosetting insulating material includes a liquid-phase thermosetting insulating material.

The optical wave guide includes a first region parallel to a top surface or a bottom surface of the insulating layer, a second region extending from one end of the first region and having the predetermined curvature of the obtuse angle, and a third region extending from the other end of the first region and having the predetermined curvature of the obtuse angle.

At least one end of the second and third regions is exposed through a top surface or a bottom surface of the insulating layer.

The first and second optical path changing parts include a thermosetting insulating material having a glass transition temperature higher than a glass transition temperature of a material for the insulating layer or include a liquid-phase thermosetting material.

The step of forming the optical wave guide includes the steps of forming a core layer to transmit the optical signal and forming at least one clad layer surrounding the core layer.

The core layer includes a material having a refractive index higher than a refractive index of a material for the clad layer.

The core layer includes at least one of silica and SiO2 mixed with polymer.

Advantageous Effects of Invention

According to the embodiment, since the optical wave guide is configured to have an obtuse curvature, the optical wave guide may not be broken by high tension applied to the optical wave guide, so that the thickness of the optical PCB laminated with the optical wave guide can be reduced.

In addition, according to the embodiment, the aperture area of the optical waveguide exposed through the top surface of the optical PCB can be increased, so that the optical devices can be readily aligned.

Further, according to the embodiment, an additional module is provided to hold the optical wave guide at the obtuse angle, so that the stability and the reliability of the optical PCB can be improved.

BRIEF DESCRIPTION OF DRAWINGS

FIG. 1 is a sectional view showing an optical PCB according to the related art;

FIG. 2 is a sectional view showing an optical PCB according to the first embodiment;

FIG. 3 is an enlarged view of an A region shown in FIG. 2;

FIGS. 4 to 10 are sectional views showing the procedure for manufacturing an optical PCB according to the first embodiment; and FIG. 11 is a sectional view showing an optical PCB according to the second embodiment.

MODE FOR THE INVENTION

Hereinafter, the embodiments will be described with reference to accompanying drawings in detail so that those skilled in the art to which the invention pertains can easily realize the embodiments. However, the embodiments may have various modifications without limitation.

In the following description, when a part is referred to as it includes a component, the part may not exclude other components, but further include another component unless the context indicates otherwise.

In the drawings, some parts may be omitted if they are not related to the embodiment and the thickness and size of each layer and each region may be exaggerated for the purpose of clarity. In addition, the similar components will be assigned with the similar reference numerals through the specification.

In the description of the embodiments, it will be understood that, when a layer (or film), a region or a plate is referred to as being "on" or "under" another layer (or film), another region or another plate, it can be "directly" or "indirectly" on the other layer (or film), region, or plate or one or more intervening layers may also be present. In contrast, if a part is referred to as being "directly on" another part, intervening layers may not be present.

Hereinafter, an optical PCB according to the first embodiment will be described with reference to FIGS. 2 to 10.

FIG. 2 is a sectional view showing an optical PCB according to the first embodiment.

Referring to FIG. 2, the optical PCB 200 according to the first embodiment includes a base substrate 207, an optical wave guide 210 laminated in the base substrate 207 to form an optical path, an optical path changing part 206 formed on at least one end of the optical wave guide 210 to allow the optical path defined by the optical wave guide 210 to have a predetermined curvature of an obtuse angle, a light transmitter 208 laminated on the base substrate 207 to transmit the light, and a light receiver 209 to receive the light transmitted from the light transmitter 208.

The base substrate 207 may include a circuit pattern (not shown) to perform electric signal transmission with respect to an insulating layer. The circuit pattern may include an electric conductive metal, such as Au, Ag, Ni or Cu. According to the present embodiment, Cu is used for the circuit pattern.

Preferably, the base substrate 207 is formed of a thermosetting resin to which a reinforcing member is impregnated. For instance, the base substrate 207 may be formed of prepreg or an epoxy-based resin, such as FR-4, BT (Bismaleimide Triazine) or ABF (Ajinomoto Build up Film) generally used as a material for a resin substrate, but the embodiment is not limited thereto.

In addition, the circuit pattern formed on the base substrate 207 may be formed through an additive process, a subtractive process, a modified semi-additive process (MSAP) or a semi-additive process (SAP). These processes are generally used to manufacture the printed circuit board, so detailed description thereof will be omitted.

In addition, although a single PCB, in which the circuit pattern is formed only on the base substrate 207, is described as an example of the base substrate 207, the embodiment is not limited thereto. For instance, a duplex PCB, in which the circuit pattern is formed on both top and bottom surfaces of the insulating layer, or a multi-layer PCB having a plurality of circuit patterns can be used as the base substrate 207.

The optical wave guide 210 is buried in the base substrate 207.

The optical wave guide 210 includes a lower clad layer 201, an upper clad layer 203 and a core layer 202 interposed between the lower clad layer 201 and the upper clad layer 203.

The lower clad layer 201 and the upper clad layer 203 surround the core layer 202 in such a manner that the optical signal can be efficiently transmitted through the core layer 202.

The lower clad layer 201 is formed under the core layer 202, and the upper clad layer 203 is formed on the core layer 202, but the embodiment is not limited thereto. For instance, only one clad layer surrounding the core layer 202 can be provided.

For instance, the lower clad layer 201 and the upper clad layer 203 may include a polymer-based material, such as acryl, epoxy, polyimide, fluorinated acryl, or fluorinated polyimide.

The core layer 202 is interposed between the lower clad layer 201 and the upper clad layer 203 to provide a transmission path of the optical signal. Similar to the lower clad layer 201 and the upper clad layer 203, the core layer 202 includes a polymer-based material. In order to efficiently transmit the optical signal, the core layer 202 has a refractive index higher than that of the lower clad layer 201 and the upper clad layer 203. The core layer 202 may include silica or SiO2 mixed with polymer.

The core layer 202 protrudes from both sides of the lower clad layer 201 and the upper clad layer 203. Both ends of the core layer 202 are cut at a predetermined angle such that both ends of the core layer 202 can be exposed through the top surface of the base substrate 207. A reflective layer including a material having high reflectivity, such as Al or Ag, can be formed on both ends of the core layer.

Since the core layer 202 is surrounded by the lower clad layer 201 and the upper clad layer 203 and has the refractive index higher than that of the lower clad layer 201 and the upper clad layer 203, the light passing through the core layer 202 is totally reflected from the interfacial surfaces between the core layer 202 and the lower/upper clad layers 201 and 203 so that the light travels along the core layer 202.

The optical wave guide 210 can be formed by performing the embossing process or the lithography process using polymeric materials having superior light transmittance and flexibility, such as organic-inorganic polymeric materials.

Preferably, the organic-inorganic polymeric material may include one selected from the group consisting of low density polyethylene, linear low density polyethylene (LLDPE), high density polyethylene, polypropylene, amide-based nylon 6 (nylon 6), nylon 66, nylon 6/9, nylon 6/10, nylon 6/12, nylon 11, nylon 12, polystyrene, polyethylene terephthalate, polybutyl terephthalate, polyvinyl chloride, polyvinylidene chloride, polycarbonate, cellulose acetate and poly(meth)acrylate. In addition, the organic-inorganic polymeric material is selected from the above materials by taking the thermal and mechanical properties into consideration or a combination including at least two of the above materials can be used as the organic-inorganic polymeric material.

The optical path changing part 206 is provided at both ends of the optical wave guide 210 having the above structure in order to allow the optical path to have a predetermined curvature.

The optical path changing part 206 changes a horizontal optical path into a curved optical path having an obtuse angle.

According to the related art, when a horizontal optical path is changed into a vertical optical path, the optical wave guide 210 is bent at the right angle. However, if the optical wave guide 210 is vertically laminated, the radius of curvature of the optical wave guide 210 is reduced, so that the bending loss may occur. In addition, great tension may be applied to the optical wave guide 210, so that the optical wave guide 210 may be broken.

Therefore, according to the present embodiment, as shown in FIG. 3, the optical wave guide 210 is changed to have a predetermined curvature of an obtuse angle, so that the optical wave guide 210 is enlarged as compared with the related art in which the optical wave guide is vertically bent. Thus, the bending loss of the optical wave guide 210 can be attenuated and the tension applied to the optical wave guide 210 can be reduced, thereby preventing the optical wave guide 210 from being broken.

The optical path changing part 206 is filled therein with thermosetting insulating materials to keep both ends of the optical wave guide 210 at the obtuse angle. In detail, the thermosetting insulating materials filled in the optical path changing part 206 may protect both ends of the optical wave guide 210 while keeping the both ends of the optical wave guide 210 at the obtuse angle.

Preferably, the inner portion of the optical path changing part 206 is formed of a material different from the material for the base substrate 207.

For instance, the optical path changing part 206 is formed of a thermosetting insulating material having the glass transition temperature higher than that of the material for the base substrate 207 or the optical path changing part 206 is formed of a liquid-phase material different from the material for the base substrate 207.

The optical wave guide includes a first region parallel to a top surface or a bottom surface of the base substrate 207, a second region extending from one end of the first region and having a predetermined curvature of an obtuse angle, and a third region extending from the other end of the first region and having a predetermined curvature of an obtuse angle.

The light transmitter 208 and the light receiver 209 receiving the light from the light transmitter 208 are disposed on the base substrate 207.

The light transmitter 208 and the light receiver 209 are spaced apart from each other by a predetermined interval on the base substrate 207. The interval between the light transmitter 208 and the light receiver 209 is determined depending on an interval between both ends of the optical wave guide 210 exposed through the top surface of the base substrate 207. Preferably, the light transmitter 208 is disposed on one end of the optical wave guide 210 exposed through the top surface of the base substrate 207 and the light receiver 209 is disposed on the other end of the optical wave guide 210 exposed through the top surface of the base substrate 207.

The light transmitter 208 generates and transmits the optical signals and includes a driver integrated circuit (not shown) and a light emitting device (not shown). The light emitting device is driven by the driver integrated circuit to emit the light toward the optical wave guide 210 exposed through the top surface of the base substrate 207.

The light emitting device may include a VCSEL (vertical-cavity surface-emitting laser), which is a light source for irradiating optical signals. The VCSEL transmits the optical signals by perpendicularly irradiating laser beams or amplifies the optical signals.

The light receiver 209 may include a receiver integrated circuit (not shown) and a light receiving device (not shown).

The light receiving device receives the light transmitted from the light transmitter 208 and is driven by the receiver integrated circuit. The light receiving device may include a PD (photodetector) that detects the optical signals.

According to the embodiment, only one optical wave guide 210 is buried in the base substrate 207. However, this is illustrative purpose only. For instance, a plurality of optical wave guide 210 may be buried in the base substrate 207.

For example, the optical PCB can be provided with a multi-channel wave guide, in which a plurality of optical wave guides 210 are formed in the same layer, or the optical PCB including a plurality of multi-layer optical wave guides 210 can be provided.

As described above, according to the optical PCB 200 of the embodiment, the optical path changing part 206 is provided to change the optical path to have the obtuse angle at both ends of the optical wave guide 210, to keep the obtuse angle of the optical path at both ends of the optical wave guide 210, and to protect the optical wave guide 210, so that the aperture of the optical wave guide 210 exposed through the top surface of the base substrate can be enlarged and the bending loss of the optical wave guide and the tension applied to the optical wave guide can be reduced.

FIGS. 4 to 10 are sectional views showing the procedure for manufacturing the optical PCB 200 according to the embodiment.

First, the lower clad layer 201 is formed by using a material having superior light transparency with respect to an optical wavelength to be used.

Then, the core layer 202 is laminated on the lower clad layer 201.

For instance, the lower clad layer 201 may be formed of a polymer-based material, such as acryl, epoxy, polyimide, fluorinated acryl, or fluorinated polyimide.

The core layer 202 is formed on the lower clad layer 201 and serves as a path for transferring the optical signals. Similar to the lower clad layer 201, the core layer 202 is formed of the polymer-based material and has the refractive index higher than that of the clad layer to efficiently transmit the optical signals. The core layer 202 may include silica or SiO2 mixed with polymer.

The core layer 202 can be formed by performing the embossing process or the lithography process using polymeric materials having superior light transmittance and flexibility, such as organic-inorganic polymeric materials.

For instance, the organic-inorganic polymeric material may include one selected from the group consisting of low density polyethylene, linear low density polyethylene (LLDPE), high density polyethylene, polypropylene, amide-based nylon 6 (nylon 6), nylon 66, nylon 6/9, nylon 6/10, nylon 6/12, nylon 11, nylon 12, polystyrene, polyethylene terephthalate, polybutyl terephthalate, polyvinyl chloride, polyvinylidene chloride, polycarbonate, cellulose acetate and poly(meth)acrylate. In addition, the organic-inorganic polymeric material is selected from the above materials by taking the thermal and mechanical properties into consideration or a combination including at least two of the above materials can be used as the organic-inorganic polymeric material.

Referring to FIG. 5, the upper clad layer 203 is laminated on the core layer 202.

In detail, the upper clad layer 203 and the lower clad layer 201 are laminated on top and bottom surfaces of the core layer 202 to protect the core layer 202.

The lower clad layer 201, the core layer 202 and the upper clad layer 203 are laminated sequentially or at a time, thereby forming the optical wave guide 210 as shown in FIG. 5.

After that, as shown in FIG. 6, the optical path changing part 206, which changes the optical path corresponding to both ends of the optical wave guide 210, is formed by using an obtuse angle setting jig 300.

In detail, both ends of the optical wave guide 210 are bent to have the predetermined curvature of the obtuse angle by using the obtuse angle setting jig 300. Then, the optical path changing part 206 is formed such that the optical wave guide 210 bent at the obtuse angle is surrounded by the optical path changing part 206. At this time, preferably, the bending angle of the optical wave guide 210 is determined by taking into consideration the maximum angle allowing the total reflection in the optical wave guide 210. For instance, the bending angle of the optical wave guide 210 is set in the range of 90° to 130°.

In more detail, a first region 204 of the obtuse angle setting jig 300 bents a left end of the optical wave guide 210 at the obtuse angle and a second region 205 of the obtuse angle setting jig 300 bents a right end of the optical wave guide 210 at the obtuse angle.

Then, as shown in FIG. 7, the first and second regions 204 and 205 of the obtuse angle setting jig 300 are filled with thermosetting insulating materials to form the first and second optical path changing parts 206 that keep the both ends of the optical wave guide 210 at the obtuse angle.

Preferably, the thermosetting insulating materials filled in the first and second regions 204 and 205 of the obtuse angle setting jig 300 are different from the material for the base substrate 207 formed therein with the optical wave guide 210.

That is, the thermosetting insulating materials may have the glass transition temperature higher than that of the material for the base substrate 207 or may be liquid-phase materials different from the material for the base substrate 207.

After that, the thermosetting insulating materials filled in the first and second regions 204 and 205 are cured, so that the both ends of the optical wave guide 210 are protected by the insulating material while keeping the obtuse angle.

Then, as shown in FIG. 8, the base substrate 207 is prepared and the optical wave guide 210 is buried in the base substrate 207.

The base substrate 207 may include the insulating layer and the circuit pattern (not shown). The circuit pattern may include an electric conductive metal, such as Au, Ag, Ni or Cu.

In addition, the base substrate 207 is formed of a thermosetting resin to which a reinforcing member is impregnated, such as prepreg. Further, the base substrate 207 may be formed of an epoxy-based resin, such as FR-4, BT (Bismaleimide Triazine) or ABF (Ajinomoto Build up Film), but the embodiment is not limited thereto.

An exposure hole (not shown) is formed on the top surface of the base substrate 207 to expose the both ends of the optical wave guide 210 to the outside.

Preferably, a first exposure hole for exposing a left end of the core layer 202 of the optical wave guide 210 and a second exposure hole for exposing a right end of the core layer 202 of the optical wave guide 210 are formed on the top surface of the base substrate 207.

Thus, the optical wave guide 210 includes a first region parallel to the top surface or the bottom surface of the insulating layer, a second region extending from one end of the first region and having a predetermined curvature of an obtuse angle, and a third region extending from the other end of the first region and having a predetermined curvature of an obtuse angle.

Then, as shown in FIG. 9, the light transmitter 208 and the light receiver 209 are mounted on the base substrate 207.

The light transmitter 208 generates and transmits the optical signals and includes a driver integrated circuit (not shown) and a light emitting device (not shown). The light emitting device is driven by the driver integrated circuit to emit the light toward the optical wave guide 210 exposed through the top surface of the base substrate 207.

The light emitting device may include a VCSEL (vertical-cavity surface-emitting laser), which is a light source for irradiating optical signals. The VCSEL transmits the optical signals by perpendicularly irradiating laser beams or amplifies the optical signals.

The light receiver 209 may include a receiver integrated circuit (not shown) and a light receiving device (not shown).

In other words, the driver integrated circuit is coupled with the VCSEL to drive the VCSEL such that the VCSEL can output the optical signal. The VCSEL is an active device that changes an electric signal into an optical signal.

The light receiving device 209 includes a receiver integrated circuit (not shown) and a light receiving device (not shown).

The light receiving device receives the light transmitted from the light transmitter 208 and is driven by the receiver integrated circuit. The light receiving device may include a PD (photodetector) that detects the optical signals.

The light transmitter 208 can be installed on one of the exposure holes formed in the base substrate 207, and the light receiver 209 can be installed on the other of the exposure holes formed in the base substrate 207.

According to the embodiment, only one optical wave guide 210 is buried in the base substrate 207. However, this is illustrative purpose only. For instance, the optical wave guide 210 can be prepared as a multi-channel or a multi-layer.

FIG. 11 is a sectional view showing an optical PCB according to the second embodiment.

Referring to FIG. 11, the optical PCB 400 according to the second embodiment includes a base substrate 407, an optical wave guide 410 laminated in the base substrate 407 to form an optical path, an optical path changing part 406 formed on at least one end of the optical wave guide 410 to allow the optical path defined by the optical wave guide 410 to have a predetermined curvature of an obtuse angle, a light transmitter 408 laminated on the base substrate 407 to transmit the light, and a light receiver 409 to receive the light transmitted from the light transmitter 408.

The base substrate 407 may include a circuit pattern (not shown) to perform electric signal transmission with respect to an insulating layer. The circuit pattern may include an electric conductive metal, such as Au, Ag, Ni or Cu. According to the present embodiment, Cu is used for the circuit pattern.

Preferably, the base substrate 407 is formed of a thermosetting resin to which a reinforcing member is impregnated. For instance, the base substrate 407 may be formed of prepreg or an epoxy-based resin, such as FR-4, BT (Bismaleimide Triazine) or ABF (Ajinomoto Build up Film) generally used as a material for a resin substrate, but the embodiment is not limited thereto.

The optical wave guide 410 is buried in the base substrate 407.

The optical wave guide 410 includes a lower clad layer 401, an upper clad layer 403 and a core layer 402 interposed between the lower clad layer 401 and the upper clad layer 403.

The lower clad layer 401 and the upper clad layer 403 surround the core layer 402 in such a manner that the optical signal can be efficiently transmitted through the core layer 402.

The core layer 402 protrudes from both sides of the lower clad layer 401 and the upper clad layer 403. Both ends of the core layer 402 are cut at a predetermined angle such that both ends of the core layer 402 can be exposed through the top surface and the bottom surface of the base substrate 407. A reflective layer including a material having high reflectivity, such as Al or Ag, can be formed on both ends of the core layer.

According to the optical PCB 200 shown in FIG. 2, the both ends of the core layer 202 are exposed through the top surface of the base substrate 207. However, according to the second embodiment, one end of the core layer 402 is exposed through the top surface of the base substrate 407, and the other end of the core layer 402 is exposed through the bottom surface of the base substrate 407.

The optical path changing part 406 is provided at both ends of the optical wave guide 410 having the above structure in order to allow the optical path to have a predetermined curvature.

The optical path changing part 406 changes a horizontal optical path into a curved optical path having an obtuse angle.

The optical path changing part 406 is filled therein with thermosetting insulating materials to keep both ends of the optical wave guide 410 at the obtuse angle. In detail, the thermosetting insulating materials filled in the optical path changing part 406 may protect both ends of the optical wave guide 410 while keeping the both ends of the optical wave guide 410 at the obtuse angle.

Preferably, the inner portion of the optical path changing part 406 is formed of a material different from the material for the base substrate 407.

For instance, the optical path changing part 406 is formed of a thermosetting insulating material having the glass transition temperature higher than that of the material for the base substrate 407 or the optical path changing part 406 is formed of a liquid-phase material different from the material for the base substrate 407.

One of the light transmitter 408 and the light receiver 409 receiving the light from the light transmitter 408 is disposed on the top surface of the base substrate 407, and the other of the light transmitter 408 and the light receiver 409 is disposed on the bottom surface of the base substrate 407.

Preferably, the light transmitter 408 is disposed on one end of the optical wave guide 410 exposed through the top surface of the base substrate 407, and the light receiver 409 is disposed on one end of the optical wave guide 410 exposed through the bottom surface of the base substrate 407.

The light transmitter 408 generates and transmits the optical signals and includes a driver integrated circuit (not shown) and a light emitting device (not shown). The light emitting device is driven by the driver integrated circuit to emit the light toward the optical wave guide 410 exposed through the top surface of the base substrate 407.

The light emitting device may include a VCSEL (vertical-cavity surface-emitting laser), which is a light source for irradiating optical signals. The VCSEL transmits the optical signals by perpendicularly irradiating laser beams or amplifies the optical signals.

The light receiver 409 may include a receiver integrated circuit (not shown) and a light receiving device (not shown).

The light receiving device receives the light transmitted from the light transmitter 408 and is driven by the receiver integrated circuit. The light receiving device may include a PD (photodetector) that detects the optical signals.

As described above, according to the second embodiment, the light transmitter is disposed on a region different from a region of the optical receiver, so the light transmission path may be variously provided.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An optical printed circuit board comprising:
   an insulating layer;
   an optical wave guide buried in the insulating layer to transmit an optical signal; and
   an optical path converting part provided on at least one end of the optical wave guide to convert a transmission path of the optical signal defined by the optical wave guide such that the transmission path has a predetermined curvature of an obtuse angle.

2. The optical printed circuit board of claim 1, wherein the optical path converting part comprises:
   a first optical path converting part provided on a first end of the optical wave guide to convert the transmission path of the optical signal; and
   a second optical path converting part provided on a second end of the optical wave guide in opposition to the first end to convert the transmission path of the optical signal.

3. The optical printed circuit board of claim 2, wherein the first and second optical path converting parts include thermosetting insulating materials surrounding the optical wave guide to keep the optical wave guide at the obtuse angle.

4. The optical printed circuit board of claim 2, wherein the optical wave guide comprises:
   a first region parallel to a top surface or a bottom surface of the insulating layer;
   a second region extending from one end of the first region and having the predetermined curvature of the obtuse angle; and
   a third region extending from the other end of the first region and having the predetermined curvature of the obtuse angle.

5. The optical printed circuit board of claim 4, wherein at least one end of the second and third regions is exposed through a top surface or a bottom surface of the insulating layer.

6. The optical printed circuit board of claim 2, wherein the first and second optical path converting parts include a thermosetting insulating material having a glass transition temperature higher than a glass transition temperature of a material for the insulating layer or include a liquid-phase thermosetting material.

7. The optical printed circuit board of claim 1, wherein the optical wave guide comprises:
   a core layer to transmit the optical signal; and
   at least one clad layer surrounding the core layer.

8. The optical printed circuit board of claim 7, wherein the core layer includes a material having a refractive index higher than a refractive index of a material for the clad layer.

9. The optical printed circuit board of claim 7, wherein the core layer includes at least one of silica and $SiO_2$ mixed with polymer.

10. The optical printed circuit board of claim 1, wherein the optical wave guide has a multi-channel structure or a multi-layer structure.

11. A method for manufacturing an optical printed circuit board, the method comprising:
    forming an optical wave guide to transmit an optical signal;
    forming an optical path converting part to convert a transmission path of the optical signal by bending at least one end of the optical wave guide; and
    burying the optical wave guide having at least one end bent by the optical path converting part in an insulating layer.

12. The method of claim 11, wherein the forming of the optical path converting part comprises:
    forming a first optical path converting part to convert the transmission path of the optical signal by bending a first end of the optical wave guide; and
    forming a second optical path converting part to convert the transmission path of the optical signal by bending a second end of the optical wave guide, which is opposite to the first end.

13. The method of claim 12, wherein the forming of the first and second optical path converting parts comprises:
    converting the transmission path of the optical signal defined by the optical wave guide such that the transmission path has a predetermined curvature of an obtuse angle.

14. The method of claim 13, wherein the forming of the first and second optical path converting parts comprises:
    surrounding the optical wave guide by the first and second optical path converting parts including thermosetting insulating materials such that the optical wave guide is kept at the obtuse angle obtained by bending the optical wave guide.

15. The method of claim 14, wherein the thermosetting insulating material includes a liquid-phase thermosetting insulating material.

16. The method of claim 13, wherein the optical wave guide comprises:
    a first region parallel to a top surface or a bottom surface of the insulating layer;
    a second region extending from one end of the first region and having the predetermined curvature of the obtuse angle; and
    a third region extending from the other end of the first region and having the predetermined curvature of the obtuse angle.

17. The method of claim 16, wherein at least one end of the second and third regions is exposed through a top surface or a bottom surface of the insulating layer.

18. The method of claim 12, wherein the first and second optical path converting parts include a thermosetting insulating material having a glass transition temperature higher than a glass transition temperature of a material for the insulating layer or include a liquid-phase thermosetting material.

19. The method of claim 11, wherein the forming of the optical wave guide comprises:
    forming a core layer to transmit the optical signal; and
    forming at least one clad layer surrounding the core layer, wherein the core layer includes a material having a refractive index higher than a refractive index of a material for the clad layer.

* * * * *